United States Patent
Knauss et al.

[19]

[11] Patent Number: 6,090,207
[45] Date of Patent: Jul. 18, 2000

[54] TRANSLATIONAL TARGET ASSEMBLY FOR THIN FILM DEPOSITION SYSTEM

[75] Inventors: Lee A. Knauss, Bowie; Steven M. Green, Greenbelt, both of Md.

[73] Assignee: Neocera, Inc., Beltsville, Md.

[21] Appl. No.: 09/053,683

[22] Filed: Apr. 2, 1998

[51] Int. Cl.$^7$ .................................................. C23C 14/00
[52] U.S. Cl. ...................... 118/715; 118/723 R; 118/726; 156/345 P; 204/298.12; 204/298.13; 204/298.18
[58] Field of Search .................. 204/298.12, 298.13, 204/298.18; 118/723 R, 715, 726; 156/345 P

[56] References Cited

U.S. PATENT DOCUMENTS 5,672,211  9/1997  Mai .......................................... 118/726

OTHER PUBLICATIONS

J.A. Greer, in Pulsed Laser Deposition of Thin Films, edited by D.B. Chrisey and G.K. Hubler (Wiley, New York, 1994), pp. 293–311.

K.H. Wu, et al., "Preparation of Large Area and Investigation of Initial Film Growth of $YBa_2Cu_3O_7$ by Scanning Pulsed Laser Deposition", Applied Physics Letters, vol. 69, No. 3, Jul. 15, 1996, pp. 421–423.

M. Lorenz, et al., "Large–area Double–Side Pulsed Laser Deposition of $YBa_2Cu_3O_{7-x}$ Thin Films on 3–in. Sapphire Wafers", Applied Physics Letters, vol. 68, No. 23, Jun. 3, 1996, pp. 3332–3334.

*Primary Examiner*—Nasser Ahmad
*Attorney, Agent, or Firm*—Rosenberg, Klein & Lee

[57] ABSTRACT

A film deposition system for coating large surfaces includes a target translated in parallel to the surface, and an energetic beam (laser beam) directed in parallel to the surface to be coated and impinging on the target, so that a plasma plume extends from the target to the surface to be coated. Translational motion of the target relative to the surface to be coated causes the plasma plume to scan over the surface and to deposit a thin film of a material from the target on the surface. Surfaces of unlimited size can be coated by this technique. The system provides short target-surface distances, high deposition rates, and can utilize small targets. An arrangement including several independently controlled and moving targets is utilized for coating surfaces having complicated shapes.

26 Claims, 9 Drawing Sheets

TRANSLATIONAL TARGET ASSEMBLY FOR THIN FILM DEPOSITION SYSTEM

BACKGROUND OF THE INVENTION

1. Field of the Invention

The present invention relates to a thin film deposition system, and more particularly to a pulsed laser deposition system utilizing a translational target and having an energetic beam directed in parallel to a substrate plane, thereby allowing material to be deposited over large areas of the substrate and characterized by a relatively short deposition distance and a small target.

Further, the present invention is directed to a technique permitting deposition of uniform film thicknesses over large, practically unlimited, surfaces of either planar or sophisticated contour configurations using a translational target assembly with an energetic beam directed towards the target surface in a direction parallel to the translational motion of the target.

More particularly, the present invention relates to a translational target assembly in thin film deposition systems wherein the target is brought close to the substrate, thereby changing the energetics of the plasma plume emerging from the target surface when the energetic beam impinges thereon, and further characterized by increased deposition rates. The overall system provides for a plume having an unchangeable or constant angle with respect to the distance of the plume from the substrate thereby providing exact reproductive characteristics of the deposition process for coating practically unlimited surfaces of the substrate.

2. Prior Art

Deposition of uniform films over large substrates is required for a variety of commercial applications, such as, for example in the design of sophisticated electronic devices. Specifically but not exclusively, such uniform films are necessary in providing superconducting delay lines with long delay times, or in fabricating multiple devices on a single substrate; to allow more efficient use of differently related process equipment needed to fabricate devices from deposited films. Generally, three techniques have been used to laser-deposit films over large areas. One of these three basic approaches to obtain large area films uses a rotating substrate and a large diameter counter-rotating target in conjunction with a rastered laser beam and large target-to-substrate distance. The technique has successfully been used to deposit $Yba_2Cu_3O_{7-x}$ (YBCO) over 75-mm-diameter substrates with good uniformity in both physical and electrical properties. A more recent version of a large area rastered system, modified to deposit films over 125-mm-diameter substrates, has a focused laser beam which is reflected from a programmable mirror held in a kinematic mount that allows the beam to be rastered over the entire diameter of the 77-mm-diameter ablation target. The rotating substrate is located 12.7 cm above the ablation target. The ablation target is offset with respect to the substrate. The advantages of this technique over the coaxial arrangement used in earlier raster systems includes the fact that a target with only about half the substrate diameter is needed to uniformly coat a given substrate size; and secondly, in the present configuration, the rastered laser beam crosses over the center of the ablation target, as the target rotates which results in the laser beam impinging at each target location from the opposite direction at a different time, reducing the growth of cones on the target surface, thereby decreasing the number of particulates that are ejected from the target surface.

In alternative large-area pulsed laser deposition (PLD) systems based on a fixed-position laser beam to deposit thin films, the laser beam was focused or imaged down close to the outer edge of a rotating ablation target. The simplest static beam approach, which was called off-axis PLD, was used to deposit films onto 25-mm-diameter substrates. In the off-axis approach, the center of the rotating substrate is offset a fixed amount, d, from the center of the ablation plume, as shown schematically in FIG. 1A. The offset distance, d, depends on the target-substrate spacing as well as the substrate diameter. If desired, a mask can be placed in front of the center portion of the substrate during the deposition run in order to impose a film's thickness in front. The off-axis process has been utilized to deposit YBCO films over 50-mm-diameter substrates, and more recently to deposit $Bi_4Ti_3O_{12}$ thin films over 100-mm-diameter silicon substrates.

Another large-area PLD technique, based on a static position laser beam approach, utilizes both substrate rotation and computer-controlled substrate translation and has been used to deposit thallium-based superconducting oxide over 50-mm-diameter substrates. Rotational-translational PLD is shown schematically in FIG. 1B. In this case, the rotating substrate is translated back and forth in one direction with respect to the plume using a computer-controlled vacuum feed-through. Allowing the center of the ablation plume to impinge close to the outer edge of the rotating substrate for a longer period of time, the properties of the deposited film exhibit good uniformity. This process has been further refined to deposit thallium-based superconducting compound over three 50-mm-diameter substrates simultaneously.

Simple and fast deposition technique for large-area high-temperature superconducting (HTSC) thin films which are necessary for the realization of HTSC devices, for example, in microwave applications, was described in the article to M. Lorenz et al, "Large-area double-side pulsed laser deposition of $YBa_2Cu_3O_{7-x}$ thin films on 3-inch sapphire wafers", *Applied Physics Letters*, 68 (23), Jun. 3, 1996, pg. 3332–3334. The technique uses the off-axis PLD technique for deposition of YBCO and gold, and a rotational-translational PLD approach is applied for $CeO_2$ buffer layers. In the off-axis approach, the center of the rotating substrate is offset a fixed amount from the center of the ablation film. An offset of about 30 mm is used with a target-substrate distance of 90 mm. With the rotational-translational approach, in addition, a controlled substrate translation during deposition is utilized in order to improve homogeneity of film properties.

Another PLD system, which has been proven to be viable in producing large-area YBCO films, was presented in the article by K. H. Wu et al, "Preparation of large-area and investigation of initial film growth of $YBa_2Cu_3O_7$ by scanning pulsed laser deposition", *Applied Physics Letters*, 69 (3), Jul. 15, 1996, pg. 421–423. In this system, a planar reflector and a concave reflector were used to guide the laser beam to a 50-mm-diameter YBCO target situated in a vacuum chamber. As best shown in FIG. 2, both the planar reflector and the target were rotated by dc motors with a small angle between the motor axis and the reflector (or target) axis, so that the reflected laser beams scanned a circle prior to impinging on the concave reflector. The focused laser beam then scanned a circle of about 25 mm in diameter on the rotating target and generated an extended plume with a diameter of 40 mm.

All the above discussed PLD systems for thin films deposition proved to be viable for deposition of films with desired uniformity of thickness and electrical properties, and demonstrated satisfactory growth rates over large-area substrates that are competitive with other physical deposition processes. However, there are still several issues that need to be addressed and phenomena that should be understood before PLD becomes a viable tool of film deposition on large areas. For instance, since the laser beam impinges to the target surface at a predetermined angle, in order to provide deposition on a large area of the substrate, the target-substrate distance must be larger. Increasing this distance to 10 cm or more, disadvantageously, will have an impact on the deposition rate as well as optimum gas pressure used to grow a given material with a desired set of properties. In lieu of the above said, it will be highly desirable to provide a PLD system for thin film deposition on a large area which would allow for providing depositions on large substrates while simultaneously maintaining a minimum target-substrate distance.

A prior art system has been developed which lowers the large substrate-target distances for depositing material on large substrates. This system which has been designed for pulsed laser deposition of homogeneous $YB_2Cu_3O_{7-x}$ films on substrates as large as 7×20 cm² has been described in the article by B. Schey et al, "Pulsed Laser Deposition of YBCO Thin Films on 7×20 cm² Substrates". As best shown in FIG. 3, as opposed to the conventional PLD arrangements discussed above, where the light of an Excimer laser is focused to a point on the target, the setup shown with an 8 cm focused line on a cylindrical target is used. A scanning of the substrate perpendicular to the focused line with an amplitude of 32 cm, leads to a homogeneous deposition of 7×20 cm² areas. The heater used in the setup consists of a ceramic box with dimensions of about 18 cm×65 cm×6 cm. Conventional heating wires are integrated in the ceramic top and bottom walls to provide a homogeneous temperature inside the ceramic box. The substrates are scanned inside this box and can be coated through a window (10 cm×5 cm) by the plasma. As it is understood, the substrate translates in scanning direction relative to the window in the ceramic top of the ceramic box. However, such prior art does not suggest any mechanism which provides translational motion of the targets along the scanning direction or any rotation of the target which may be interrelated with the translational motion of the targets.

The afore-discussed prior art system with the laser beam parallel to the scanning direction of the substrate is not limited to large target-substrate distances and is adaptable for coating large substrate areas. The present invention, however, taking advantage of the laser beam directed in parallel to the substrate surface, introduces a new and unique approach to PLD technique, which allows coating practically unlimited surfaces with uniform thin films by means of employing translational motion of the target relative to the substance in parallel to the laser beam, and both in parallel to the surface of the substrate.

SUMMARY OF THE INVENTION

It is therefore an object of the present invention to provide a thin film deposition system and technique employing translational target assembly for coating large-area substrates, wherein the direction of the energetic beam impinging into the target surface and the direction of the target translation is parallel to the surface of the substrate to be coated.

It is another object of the present invention to provide a pulsed laser deposition (PLD) system utilizing target translation relative to the substrate with an energetic beam directed in parallel to the substrate plane allowing the material to be deposited over a large area with a short deposition distance and further minimizes the size of the targets.

It is a further object of the present invention to provide a pulsed laser deposition (PLD) technique and system which does not have a limitation on the size of the substrate, and which enables increased deposition rates and highly reproducible characteristics and parameters of the process.

It is still another object of the present invention to provide a PLD technique and system for deposition of uniform thin films over the surfaces having either planar or sophisticated configurations, and, if desired, for coating of opposite surfaces of the substrate simultaneously.

It is still a further object of the present invention to provide a PLD system capable of utilizing a plurality of individually translating targets for coating a variety of surfaces on the substrates.

The teaching of the present invention may find its utility in any directed energetic beam deposition system utilizing either solid or gaseous target, but preferably used in conjunction with a pulsed laser deposition system.

In accordance with the teaching of the present invention, the film deposition system comprises a substrate having at least one surface to be coated, a target which translates in parallel to the surface of the substrate, and an energetic beam directed in parallel to the surface of the substrate to be coated and impinging into the target which is angled to the surface of the substrate. A plasma plume, which is caused by impinging of the energetic beam into the target, extends from the target towards the surface of the substrate. Translational motion of the target relative to the substrate causes the plasma plume to scan over the surface of the substrate, thereby depositing a film thereon.

Optionally, the target may include either solid or gaseous matter. Preferably, the target is rotated, so that the ablation surface thereof rotates in a plane angled to the surface of the substrate to be coated.

It is essential that driving means are provided which enable translating motion of the target in parallel to the surface of the substrate to be coated. The driving means, in the preferred embodiment includes a drive motor and a worm drive which is actuated by the drive motor in order to translate the target in parallel to the surface of the substrate. A first beveled gear is positioned at the end of the worm drive, while the target is maintained on a second beveled gear which is angled with respect to the first beveled gear. Being in engagement with each other, the second beveled gear receives a rotational force from the first beveled gear, thereby enabling rotational motion of the target in the plane angled to the surface to be coated.

Optionally, any kind of energetic beam including electron beam, ion beam, or laser beam may be used for the purpose of depositing thin films on surfaces.

In one of the possible embodiments of the system, where the substrate is positioned above the target, the unwanted particles from the target or any other mechanical components of the system do not reach the substrate. However, if an alternative positional arrangement is desired, for instance, when the substrate is positioned below the target, a plume aperture may be used to prevent particles from reaching the surface of the substrate. This plume aperture, preferably, is fixed to the translating target in order to move in synchronism thereto, resulting in the plasma plume being aligned with the aperture.

A laser beam focusing lens is preferably used in the subject system which is translated in synchronism with the translating target in order to insure the fluence of the laser beam at the target. The distance between the target and the focusing lens is maintained substantially constant during the process either by means of mechanical connection therebetween such as a connecting rod, or by providing an auxiliary motor to drive the focusing lens in synchronism with the drive motor driving the target.

Although the translational movement of the target relative to the substrate is an important aspect of the present invention, the substrate, if desired, may be rotated or translated in any desired direction.

In the present system, opposing surfaces of the substrate may be coated simultaneously. For this purpose, a symmetrical system is provided adjacent to one of the opposing sides of the substrate which operates in a similar manner to the system described previously.

The substrate, in accordance with the system herein described, may have a wide variety of dimensions and shaped and may include such materials as continuous tape, wire, plastic sheathing, semiconductor wafers or other elements.

When the surface of the substrate is a non-planar surface and has a sophisticated structure positioned thereon, the system may include two, three and even more separate targets each of which would move individually in parallel to each respective surface of the structure. The laser beam will then be split into beam portions, and each of the beam portions will be directed to the respective one of said plurality of the targets. Involvement in the process of several targets moving in different directions, rotation and translation of the substrate provides a highly satisfactory uniform film deposited on the surfaces of structures of different shapes. Targets for the purposes of depositing films on distinct surfaces of the structures, may be positioned in different distinct planes and moved in distinct directions. The multiple laser beams and targets arrangement enables a full 3-dimensional coating.

The system of the present invention advantageously provides uniform film deposition on substrates of a wide variety of shapes, with no physical limitation of the substrate size and with reduced target-substrate distance as well as higher deposition rates. Due to the parallel motion of the target and synchronous translation of the target and focusing lens, the plasma plume is rastered without any change in laser beam spot size, target-substrate distance, or plume-to-substrate angle which substantially improves reproducibility of the process for large-area film growth.

The present invention also teaches a method for film deposition comprising the steps of directing an energetic beam substantially in parallel to the surface of the substrate to be coated to impinge at the surface of the target, and translating the target along the substrate substantially in parallel to the surface thereof.

The generated plasma plume extending from the target and reaching the surface of the substrate, then scans over the surface of the substrate, thereby coating this surface in a desired manner. Simultaneously, the substrate can be rotated or translated in any desired direction.

These and other novel features and advantages of this invention will be fully understood from the following detailed description and the accompanying drawings.

DETAILED DESCRIPTION OF THE PREFERRED EMBODIMENT

Figure 1A:
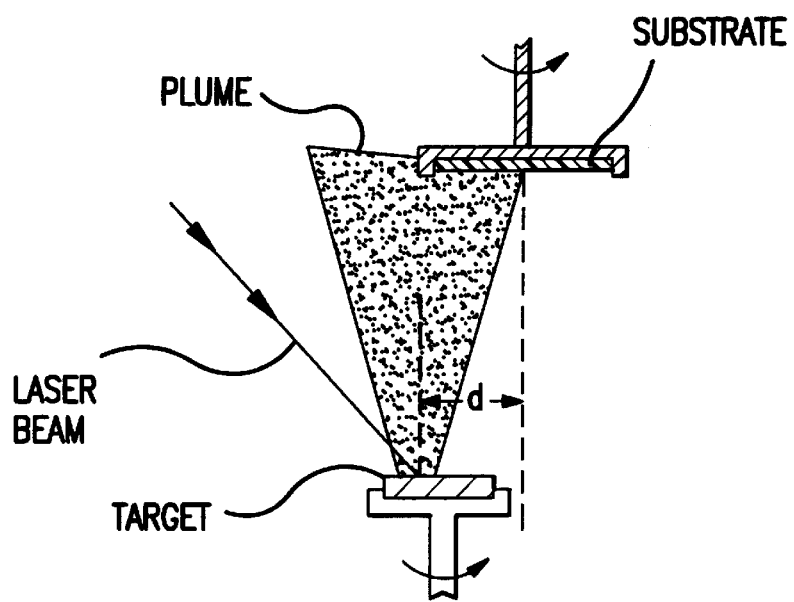
FIG. 1A shows schematically the off-axis PLD technique of the prior art.
Figure 1B:
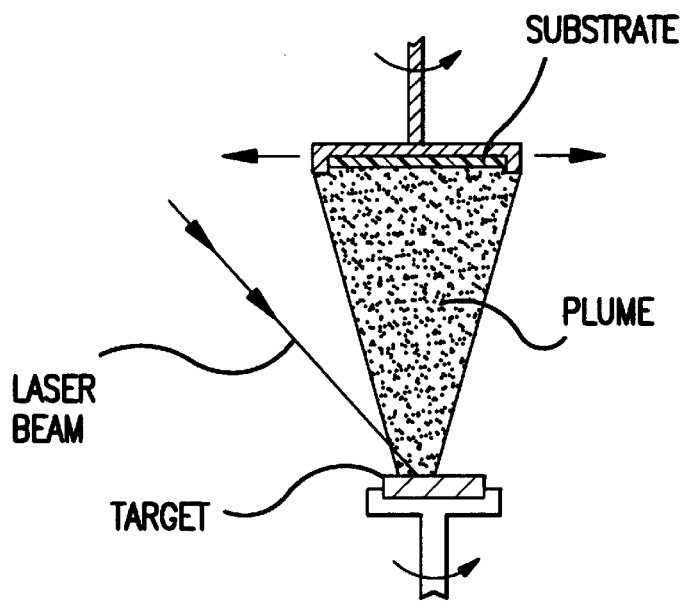
FIG. 1B shows schematically the rotational-translational PLD technique of the prior art.
Figure 2:
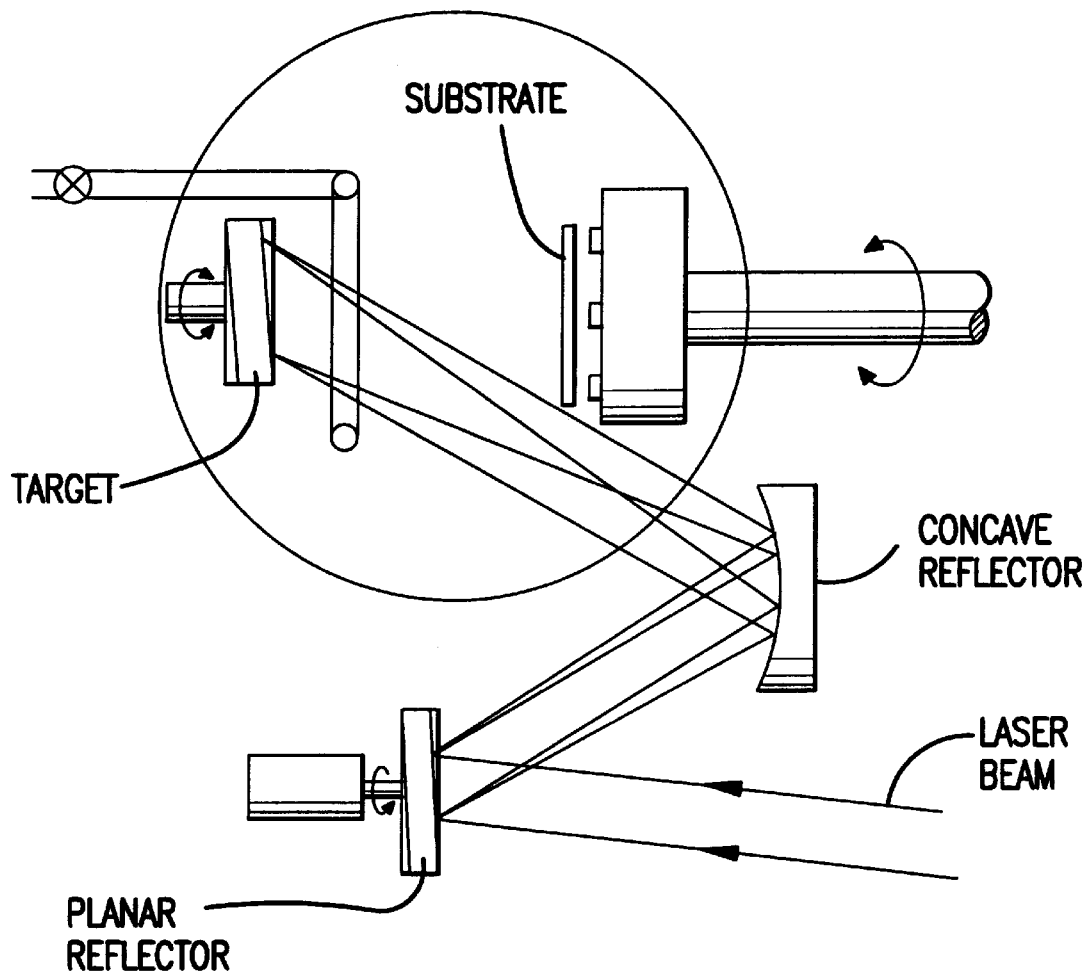
FIG. 2 shows schematically the modified PLD system of the prior art utilizing a planar reflector and a concave reflector.
Figure 3:
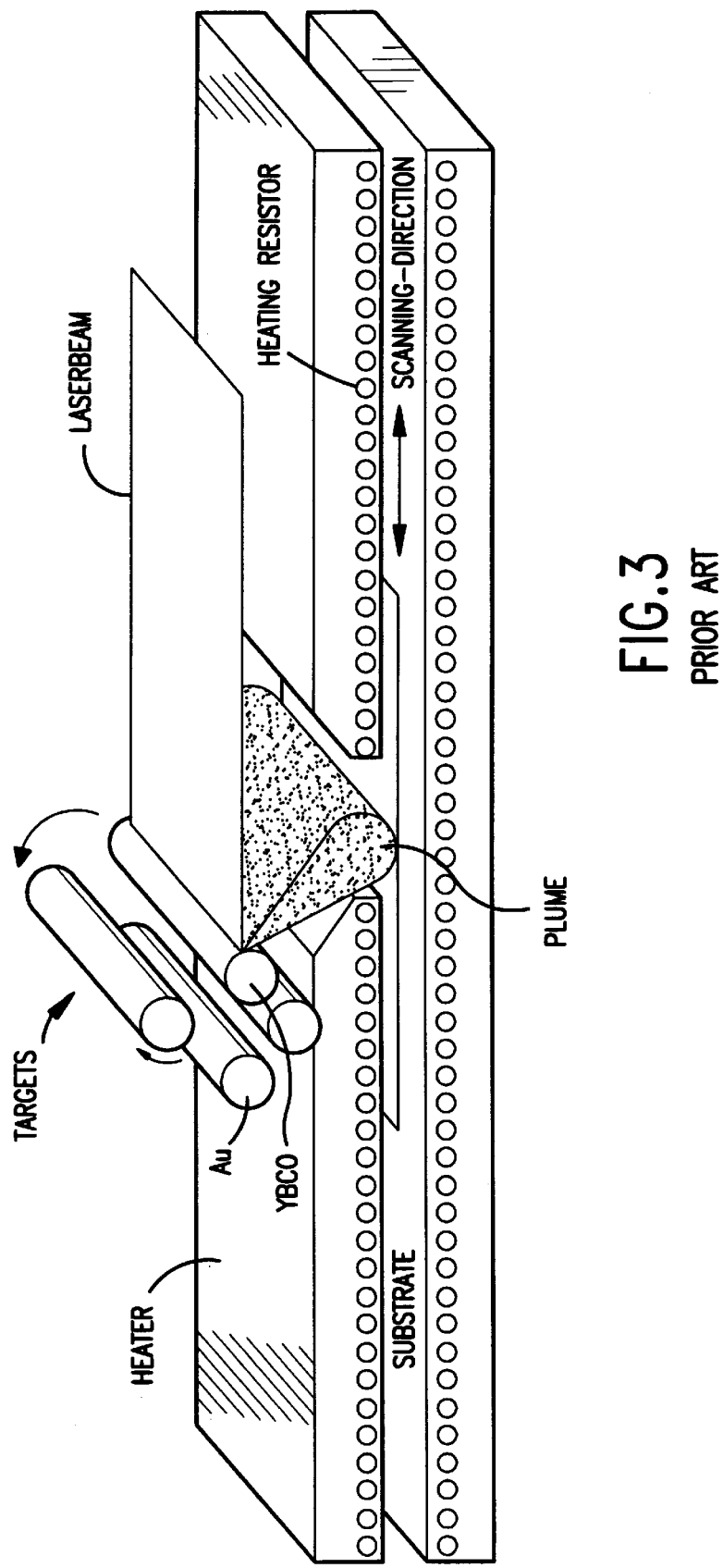
FIG. 3 shows the experimental PLD setup for the deposition of YBCO films on large substrates utilizing a laser beam directed in parallel to the surface of the substrate, according to the prior art.
Figure 4:
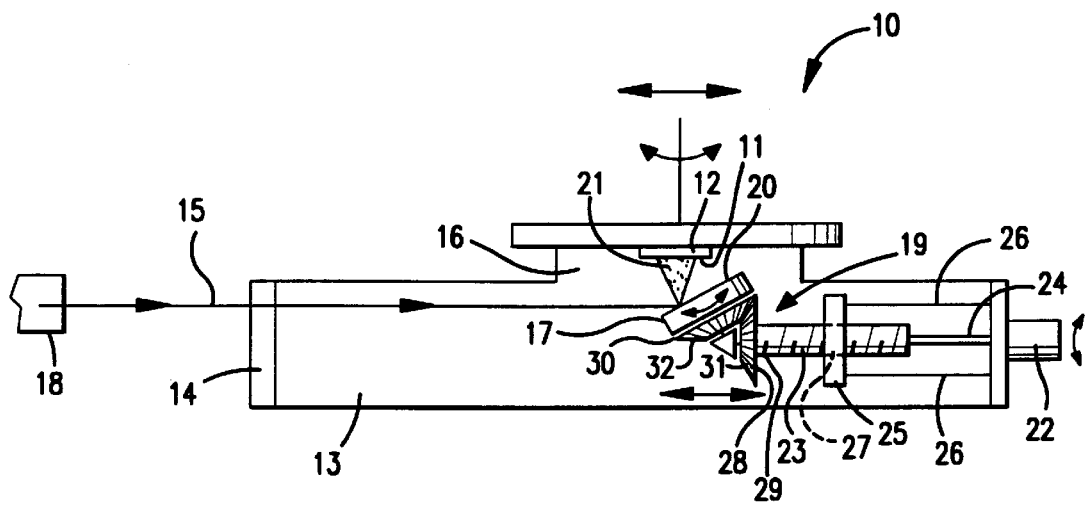
FIG. 4 is a schematic diagram of a PLD system of the present invention utilizing a translational target assembly.
Figure 5:
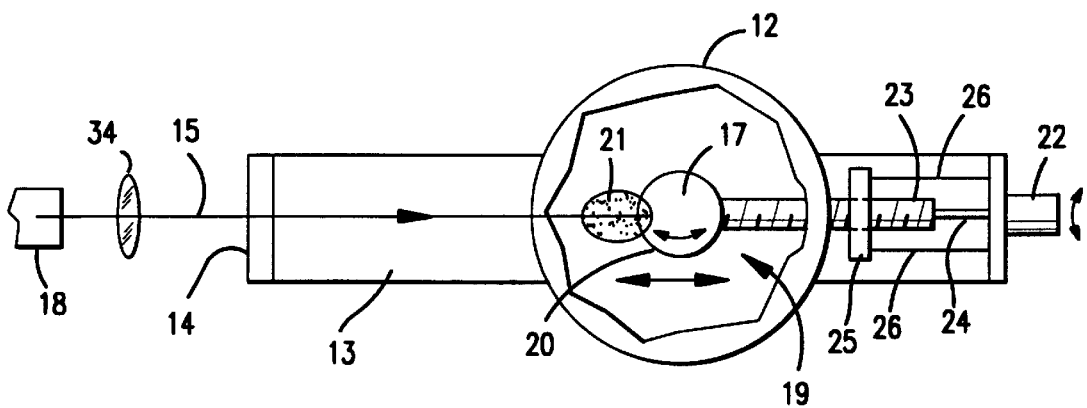
FIG. 5 is a top view of the film deposition system of FIG. 4.

Referring to FIGS. 4, 5, 6, 7, and 9, film deposition system 10 of the present invention designed for depositing films of different materials on surfaces 11 of a substrate 12 includes a processing vacuum chamber 13 having a vacuum window 14 allowing an energetic beam 15 therethrough. The vacuum chamber 13 accommodates all components of the film deposition system 10 (described hereinafter) and has an opening 16 allowing access of the matter to be deposited to the surface 11 of the substrate 12. The essential components of the film deposition system 10 of the present invention include a target 17, a source 18 of the energetic beam 15, and a translational-rotational mechanism 19 enabling translational motion of target 17 in parallel to the surface 11 of substrate 12, and simultaneously enabling rotational motion of the target 17. Target 17 and the translational-rotational mechanism 19 of the present invention constitutes a translational target assembly (TTA) of the film deposition system 10.

The film deposition system 10 of the present invention can use any directed energetic beam, including electron beam, ion beam, etc., however for sake of simplicity, a pulsed laser deposition system using a laser beam will be described herein. A laser, which serves as a source of the laser beam 15, can be chosen from a variety of commercial Excimer lasers which are currently available in the 50–100 watt power range. The laser 18 is to be chosen for a particular application according to the substrate size or area to be coated and desired deposition rate. From the standpoint of the power requirements for the laser, it is recommended to choose the laser which would drive the system at about 60–70% of its rated energy to improve the longevity of the laser components. Usually lasers that provide about 500 mJ per pulse (248 nm) and repetition rates of at least 100 Hz are recommended for large-area applications.

As best shown in FIGS. 4–7, 9, and 14, the laser beam 15 is directed in parallel to the surface 11 of the substrate 12. This arrangement advantageously enables bringing the target 17 closer to the substrate 12, thereby increasing deposition rates and improving the deposition process. The laser beam 15 impinges into the ablation surface 20 of the target 17, energizes matter of the target matter, thereby producing a plasma plume 21 extending from the surface 20 of the target 17 towards the surface 11 of the substrate 12 to be covered by the matter of the target 17. The plasma plume 21 consists of highly energized atoms of the material to be deposited, which being supplied to the surface of the substrate 12, form a film on the surface 11 of the substrate 12. In order to uniformly ablate the surface of the target 17, the laser beam impinges in different areas of the target 17, which is provided by rotational motion or displacement of the target 17. The ablation surface 20 of the target 17 rotates in a plane angled or inclined with respect to the surface 11 of the substrate 12, and the beam 15 is scanned over the surface 20 of the target 17, with the direction of the laser beam 15 remaining parallel to the substrate plane. The material of target 17 may include YBCO, $Bi_4Ti3O_{12}$, thallium-based superconducting oxides, and other materials currently used in PLD systems.

During the deposition, target 17 translates substantially in parallel to surface 11 of substrate 12 which is to be coated by the film. Along with the translational motion of target 17, the plasma plume 21 scans over the surface 11 of the substrate 12, thereby depositing matter on the areas scanned. The process of film deposition in the system 10 of the present invention is similar to the "spraying of paint over a surface to be painted." In order to provide more uniform film deposition on the surface 11 of the substrate 12, the substrate 12 may also be rotated or subjected to translational motions in any desired direction or plurality of directions. The substrate 12 may be translated reversibly with respect to the laser plume 21 or rotated by using a computer-controlled vacuum feed-through (not shown). Accordingly, the properties of the deposited film may be made quite uniform, may be varied in any desired pattern by controlling speed and pattern of translational motion of the target 17, as well as translational-rotational motion of the substrate 12. Specifically, target 17 may be controlled to provide a plasma plume 21 impingement close to the outer edge of the rotating substrate 12 for a longer period of time than, for instance, at the center thereof, thereby providing better uniformity of the deposited film.

The arrangement of the present invention, when the plasma plume 21 scans over the surface of the substrate 12 in a reversible manner, provides a uniform deposition pattern having minimal change in the angle of the plasma plume 21 relative to the substrate 12. The distance of the plasma plume 21 relative to the substrate 12 does not change during the deposition process, which is advantageous for enhancing uniformity of the deposited film. Since the laser beam 15 is directed in parallel to the surface 11 to be coated, there is no limitation on the size of the surface 11. Substrate 12 may be a wafer, continuous tape, wire, plastic sheathing, or other varying contour materials having any length accessible by the translating mechanism of the target 17. Due to translational motion of the target 17 relative to the substrate 12, a small target can be used in place of large targets disadvantageously used in some prior art PLD systems.

As best shown in FIGS. 4, 6, 7, and 9, target 17 rotates in a plane angled or inclined to the surface 11 of the substrate 12. Although the laser beam 15 and the direction of translation of the target 17 are positioned in parallel to the surface 11 of the substrate 12, this arrangement allows the plasma plume 21 to be directed relatively close to the normal surface of the substrate 12. By adjusting the angle of the rotation of the target 17 relative to the surface 11 of the substrate 12, the angle of the plasma plume 21 relative to the surface 11 may be controlled.

Since target 17 travels along the surface 11 of the substrate 12 to be coated, small targets may be utilized in the process which will sufficiently supply matter to the surface 11. The laser beam 15 is focused down to a certain spot on the ablation surface 20 of the target 17, and while the target rotates, the laser beam etches a circular trench in the target surface 20 that can significantly change the ejection angle of the plasma plume 21, that may have an impact on the growth rate and uniformity of film thickness. Since a small target 17 is used in the technique of the present invention, the target may be resurfaced after a predetermined number of passes with an abrasive such as emory paper in order to obtain more reproducible results. In order to obviate any trenching problem, the system may incorporate the ability to slightly reposition the laser beam 15 during the deposition process, keeping the parallel direction of the laser beam 15 relative to the surface 11 of the substrate 12.

The translational-rotational mechanism 19 of the present invention includes a driving mechanism enabling translational motion of the target 17 and rotational mechanism enabling rotational motion of the target 17. The driving mechanism consists of a drive motor 22 and a worm drive 23 rotated by the drive motor 22 through a keyed shaft 24. A threaded plate 25 is mounted within the vacuum processing chamber 13 and is supported therein by support rods 26. The threaded plate 25 has an aperture 27 best shown in FIG. 4, through which the worm drive 23 protrudes and, being rotated by the keyed shaft 24, provides translational motion to the target 17. A bevel gear 28 is affixed to the edge 29 of the worm drive 23. Another bevel gear 30 is positioned at a predetermined angle to bevel gear 28. Teeth 31 of the bevel gear 28 and teeth 32 of the bevel gear 30 engage each other so that any rotational motion of the bevel gear 28, enabled by rotational motion of worm drive 23 actuated by drive motor 22, transforms into the rotational motion of bevel gear 30, so that the target 17 affixed to the bevel gear 30 rotates in the desired direction, dependent on the direction of rotation of the drive motor 22. Therefore, the drive motor 22 enables simultaneous translational and rotational motion or displacement of the target 17. By controlling electrical characteristics of the drive motor 22, the speed and direction of the rotation and translation of target 17 setting can be adjusted and controlled.

Figure 9:
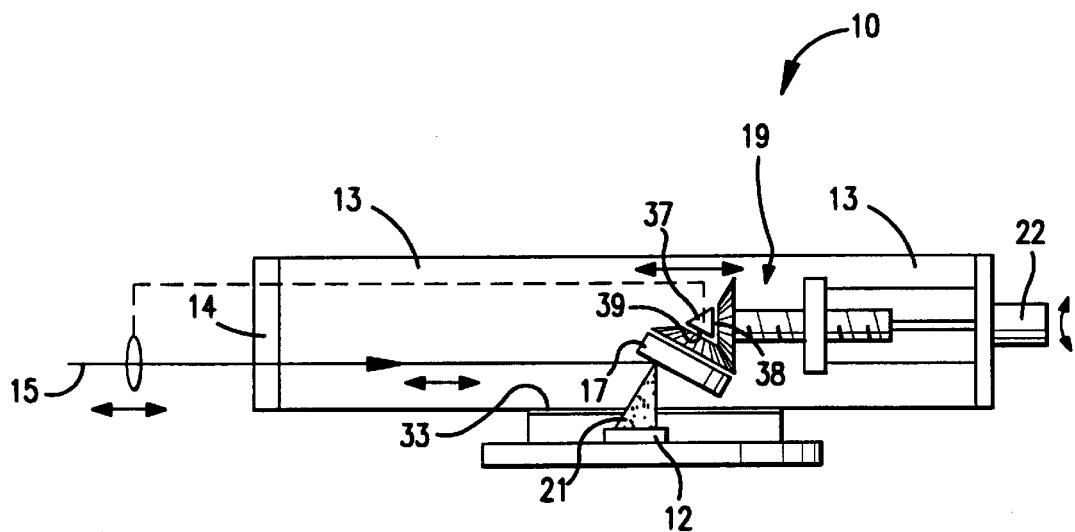
FIG. 9 is a schematic diagram of the film deposition system of the present invention, wherein the substrate is positioned below the target.

As best shown in FIGS. 4–7, the substrate is positioned above the target, which is advantageous for preventing unwanted particles from reaching the surface 11 of the substrate 12. Whenever the opposite disposition or placement is needed, where the substrate 12 is located below the target 17, a plume aperture 33 is utilized between the surface of the substrate 12 to be coated and the target 17 as shown in FIG. 9.

In the film deposition system 10 of the present invention, where laser beam 15 is used as the energetic beam, the focusing lens 34 positioned between the laser 18 and the target 17 is translated along with the target 17 to maintain the laser plumes 21 at the target 17. Two techniques are used to accomplish these goals: mechanical, where the mechanical connection between the target 17 and the focusing lens 34 maintains the distance between the target 17 and lens 34 practically unchangeable; and electrical, utilizing means to control the drive motor 22, which drives the target 17, and an auxiliary motor 35 (to be discussed in following paragraphs) driving the focusing lens 34.

Figure 6:
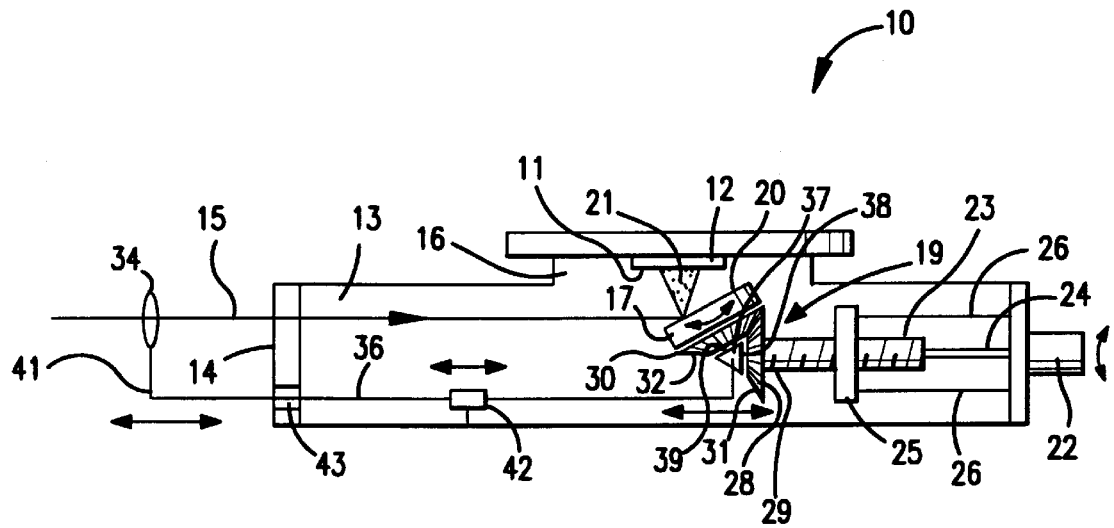
FIG. 6 is a schematic representation of the film deposition system of the present invention showing a mechanical connection between the focusing lens and the translational mechanism of the translational target assembly of the present invention.
Figure 7:
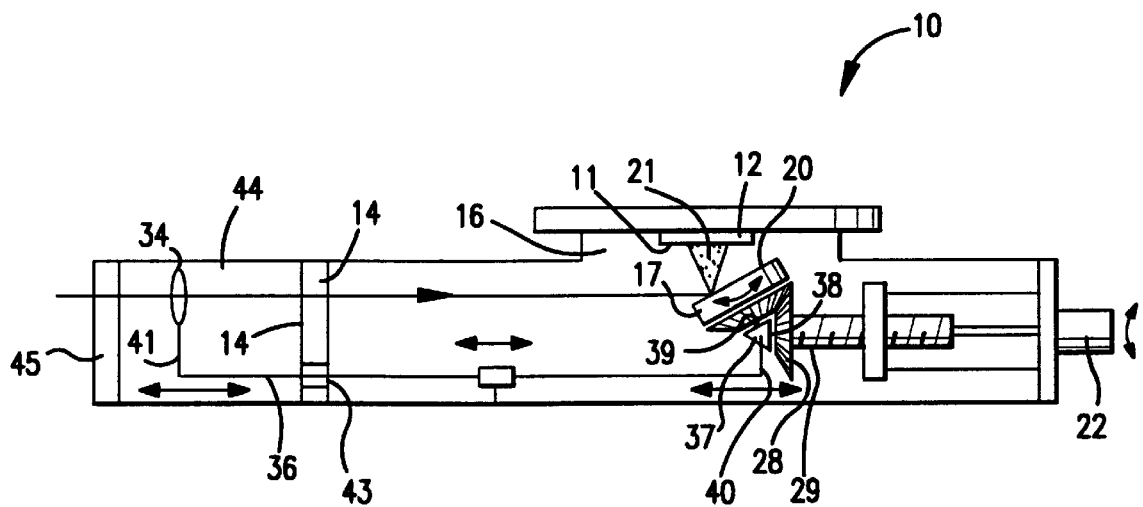
FIG. 7 shows an alternative embodiment of the film deposition system of the present invention.

As best shown in FIGS. 6 and 7, which represent the mechanical approach to the problem, a rod 36 is connected between the focusing lens 34 and the target 17. Particularly, a supporting member 37, having two surfaces 38 and 39, each supporting rotationally respective bevel gears 28 and 30, receives one edge 40 of the connecting rod 36, while another edge 41 of the rod 36 is affixed to the focusing lens 34. Therefore, once the supporting member 37 is enabled by the drive motor 22 and the worm drive 23 to translate along the translational motion direction of the target 17, the focusing lens 34 is forced to translate the same distance in the same direction and with the same speed as the target 17. As best shown in FIG. 6, a support 42 through which the connecting rod 36 protrudes, supports the rod 36 in a predetermined position within the vacuum chamber 13 needed for the purpose intended and so that the connecting rod 36 is able to slide back and forth through a vacuum feed-through 43 provided in the vacuum window 14.

In another implementation of the mechanical connection approach, best shown in FIG. 7, an additional vacuum chamber section 44 is provided where the focusing lens 34 is positioned. The additional vacuum window 45 is provided for the laser beam 15 to penetrate therethrough. When the connecting rod 36 connecting the lens 34 and the target 17 slides back and forth within the vacuum feed-through 43 in -the vacuum window 14, the focusing lens 34 translates within the additional vacuum chamber section 44 of the vacuum processing chamber 14 between the vacuum window 14 and the additional window 45 along with the translational motion of the target 17.

Figure 8:
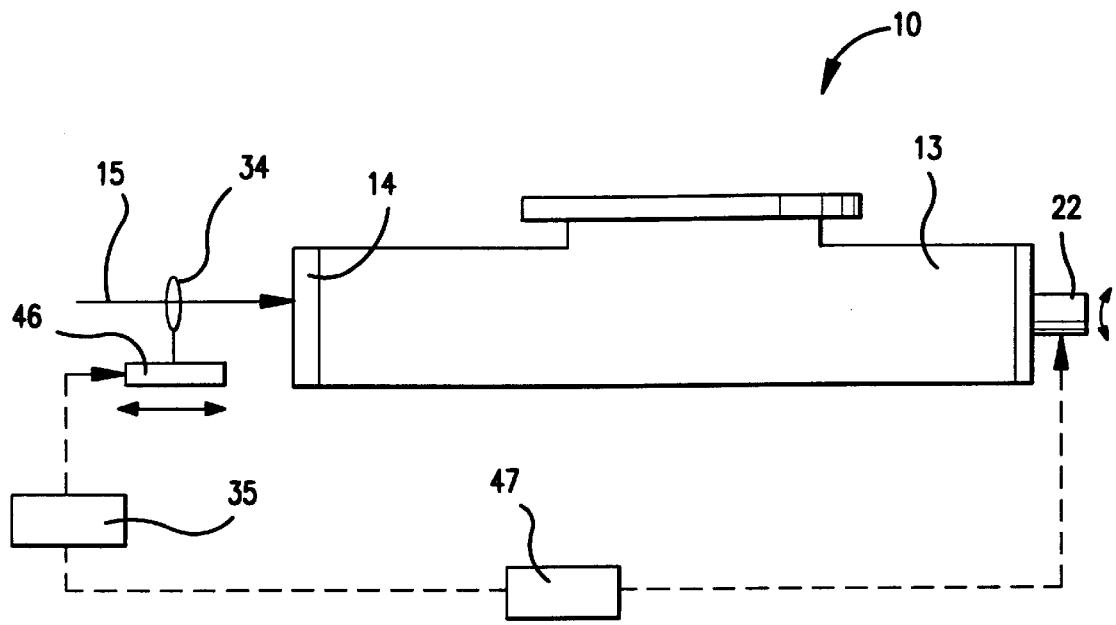
FIG. 8 is a schematic diagram of the film deposition system of the present invention showing the drive motor enabling translational motion of the target and auxiliary motor enabling a translational motion of the focusing lens working in synchronized mode.

As previously discussed, an electrical, or electro-mechanical approach to the problem of maintaining the laser fluence at the target 17, contemplates the use of the auxiliary motor 35. As shown in FIG. 8, the focusing lens 34 is carried by a motorized stage 46 driven by the auxiliary motor 35 which is synchronized to the drive motor 22 enabling the translational motion of the target 17. The drive motor 22 and the auxiliary motor 35, are synchronized by a synchronizing unit 47 controlling both motors so that both motors drive the target 17 and the focusing lens 34 in the same direction with the same speed and the same distance, thereby maintaining a substantially constant distance between the lens 34 and the target 17 during the deposition process.

For the inverted translational target assembly of the film deposition system 10 of the present invention, where the substrate is positioned below the target 17, the plume aperture 33, shown in FIG. 9, minimizes dirt and unwanted particles that could fall on the substrate. The plume aperture 33 discussed above, should be attached to the translational mechanism at the target 17, particularly to the supporting member 37, to enable the plume aperture 33 to maintain a constant position relative to the plasma plume 21. Dirt and unwanted particles from the target 17 and translational-rotational mechanism 19 of the TTA are less likely to fall on the substrate 12.

Figure 10:
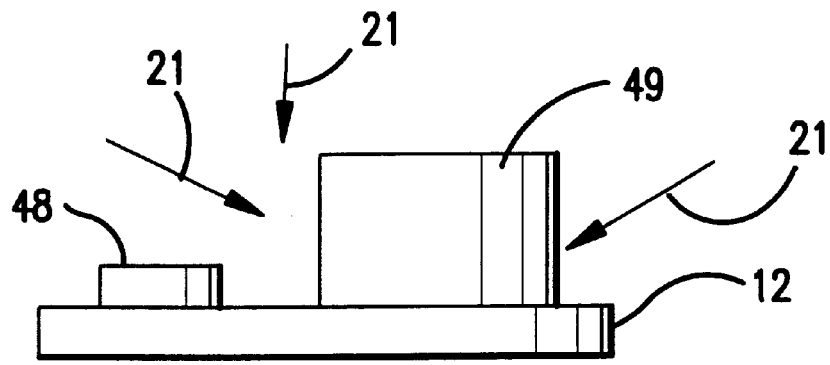
FIG. 10 shows schematically and on enlarged scale, a substrate carrying certain structures thereon which are to be coated.
Figure 11:
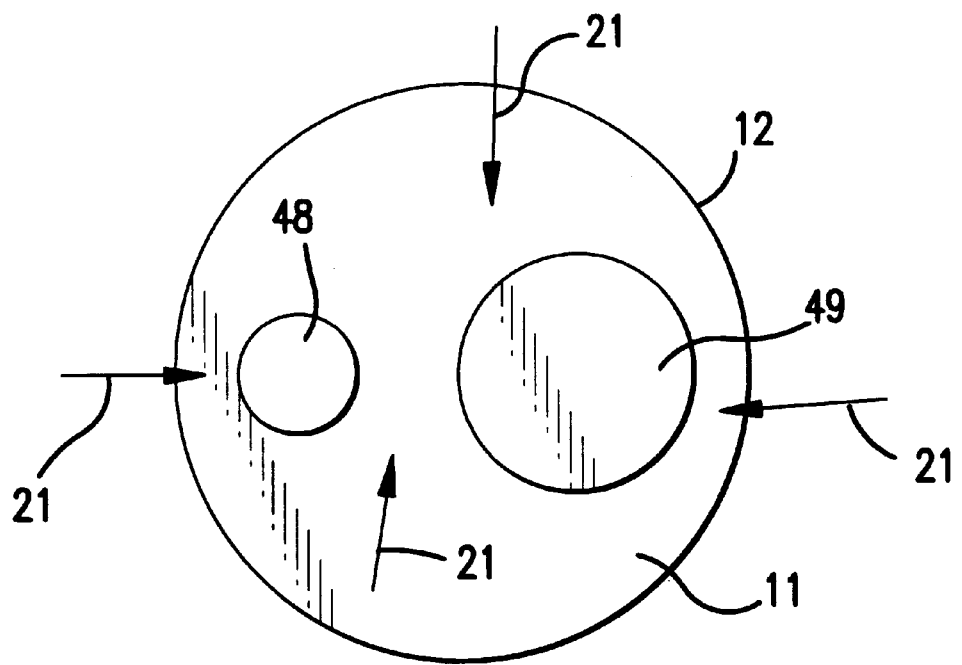
FIG. 11 is a top view of the substrate with the structures as shown in FIG. 10.
Figure 12:
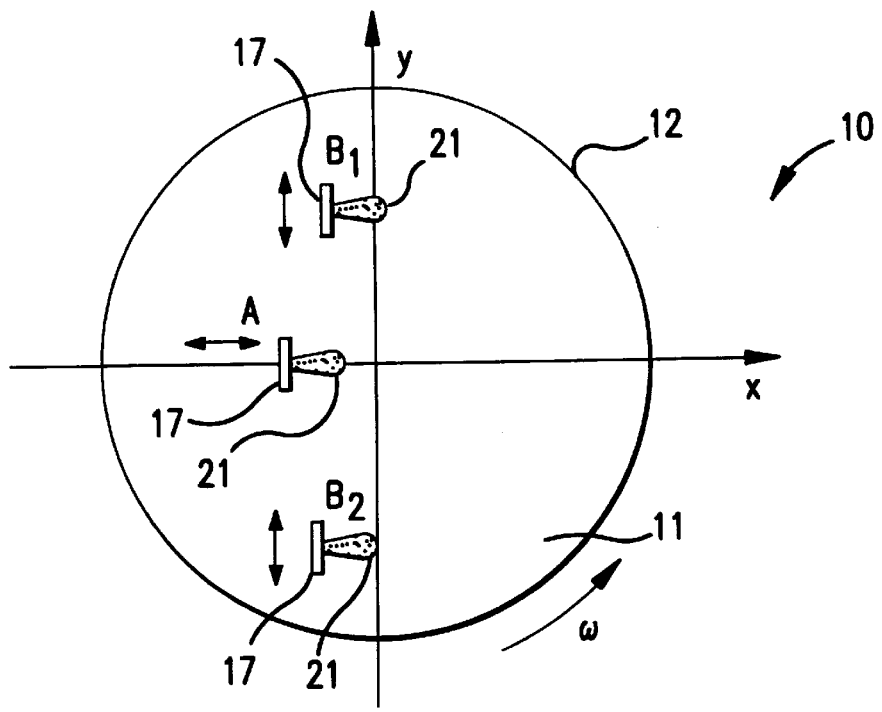
FIG. 12 shows schematically a film deposition system utilizing principles of the present invention and employing a plurality of targets moving in different directions for depositing uniform films on all surfaces of the structures shown in FIGS. 10 and 11.

In prior paragraphs, the coating process has been limited to a flat surface 11 of the substrate 12. However, current technologies sometimes require coating surfaces that have structures mounted thereon. FIGS. 10 and 11 show a wafer substrate 12 having structures 48 and 49. In order to deposit films on the structures 48 and 49 uniformly and also onto the surface 11 of the substrate 12, more than one target may be employed and ablated. By that arrangement, the plasma plumes 21 of each target impinge onto the respective surface of the structure and on the substrate as schematically shown in FIGS. 10 and 11. Simultaneously, the substrate 12 may be rotated or also translated in predetermined directions. As shown in FIGS. 10 and 11, in order to coat the structures 48 and 49 on the substrate 12, angled plume impingement on the surface of the substrate from all sides is provided. This may be accomplished with, for instance, three targets (and three plumes), and substrate rotation as shown in FIG. 12. Target A in this example was scanned in parallel to the surface 11 of the substrate 12 and along a diameter x with its plume 21 pointing radially. Both sides of yz plane structures will be coated by scanning entire diameter. The targets B1 and B2 scan along radii y, the radii y being the x, and each radius y on an opposing side of the x diameter. Their plumes 21 point along the direction x and coat both sides of yz plane structures rotated 90° with substrate ω rotation. It will be understood by those skilled in the art that more independently programmed targets could be used to provide better uniformity. This, however, may cause complication of the film deposition system; besides, more laser power or more lasers would be needed for the film deposition system.

Figure 13:
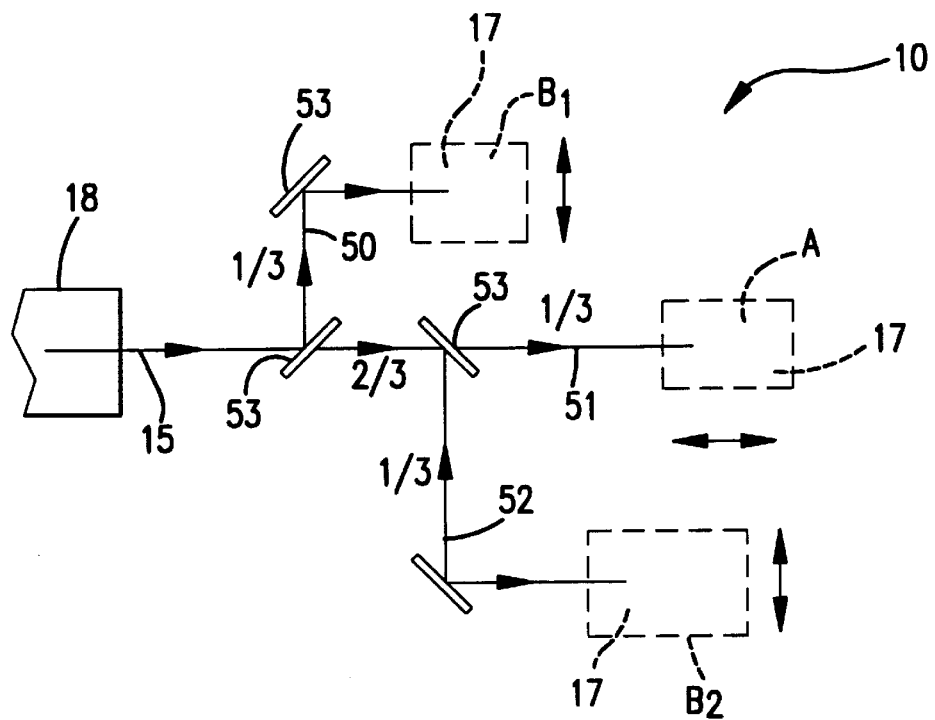
FIG. 13 shows somewhat schematically the energetic beam split by beam splitters in the arrangement of FIG. 12.

As best shown in FIG. 13, beam splitting technique are utilized for coating of complicated surfaces on the substrate 12. The laser beam 15 from the laser 18 is split in three beam portions 50, 51, 52 and each is directed towards a respective one of the targets A, B1 or B2. Since this arrangement uses angled targets A, B1 and B2, the beam can be directed along a parallel path with respect to the substrate surface. By independently controlling translational motion of each of the targets along the surface to be coated, and arranging each laser beam to scan over a respective target, a uniform deposition on the structures 48 and 49, shown in FIGS. 10 and 11, with uniform target erosion may be achieved.

Figure 14:
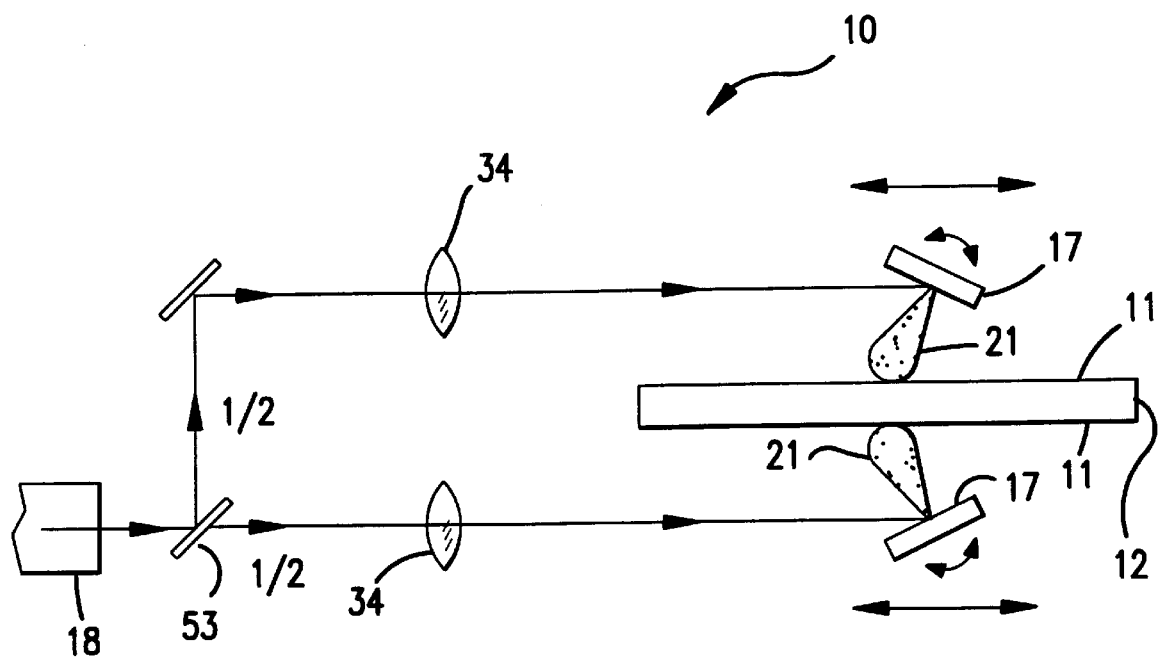
FIG. 14 shows schematically film deposition system of the present invention utilizing a pair of targets translating at both opposite sides of the substrate for simultaneously depositing films thereon.

When opposing surfaces 11 of the substrate 12 are to be coated with a thin film, a pair of translational target assemblies may be symmetrically disposed adjacent both surfaces of the substrate 12, as best shown in FIG. 14. All components of this arrangement are similar to that which has been discussed above. The laser beam 15 may be split by beam splitter 53 into two beams, one directed to the target above the substrate 12 and another directed to the target below the substrate 12. Both targets 17 execute a translational motion substantially in parallel to the surfaces of the substrate 12, and these beam portions are directed substantially in parallel thereto. Similar or different materials may be deposited on the opposite surfaces 11 of the substrate 12, depending on the material of the targets 17. Each of the TTAs, below and above the substrate, can be controlled individually or synchronously.

As it is clear from the above discussion of the new thin film deposition system and technique, the present invention constitutes an improvement and contribution to the art and provides the following advantageous features:

- the laser beam is directed parallel to the surface of the substrate to be coated, whereby the system enjoys a short target-substrate distance that changes the energies of the plasma plume and enables increased deposition rates;
- the plasma plume is rastered back and forth in a uniform way, with no change in the angle of the plume relative to substrate, thereby providing highly reproducible characteristics of the plume;
- the combination of the laser beam being directed in parallel to the substrate to be coated and the new concept of translating the target relative to the surface of the substrate, there are no physical limitations on the size of the surface to be coated with the film;
- the new concept of translating the target relative to the surface to be coated, no large targets are needed, and small targets are applicable for the intended purpose of this film deposition system;
- the unique and new concept of target translational motion makes it possible to employ several targets moving in different directions which are independently controlled in order to coat complicated structures on the surface of the substrate;
- the unique concept of translating multiple targets relative to the surface of the substrate, makes it possible to deposit films with particular features, at each of the movable targets may be translated at a desired speed, in desired a direction, and may be stopped at certain areas of the surface to be coated in order to deposit a thicker layer of the film thereat. Therefore, any desired profile of the film may be deposited on the surface of the substrate.

The concept of the present invention is not only applicable to the use of a solid target, but also to the use of gaseous target, where the gaseous target is disposed along the surface to be coated and is subjected to the energetic beam which would produce a plasma plume directed towards the surface.

The film deposition system of the present invention is envisioned as being for use with any kind of substrate surface to be covered, including wires, continuous tapes, wafers, etc., utilizing any type of energetic beam, including electron beam, ion beam, laser beam, etc.

It is to be understood that system 10 may incorporate a plurality of lasers 18 to provide a multiplicity of lasers 18 to provide a multiplicity of laser beams 15 which may be used in place of or in conjunction with beam splitter 53 which is envisaged within the scope of the present invention.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described. Certain features may be used independently of other features and in certain cases, particularly location of elements, may be reversed or interposed, all without departing from the spirit or scope of the invention as defined in the dependent claims.

What is claimed is:

1. Film deposition system, comprising:
    a substrate having at least one surface,
    a target translating substantially in parallel to said at least one surface of the substrate, and
    at least one energetic beam having an impingement segment directed substantially in parallel to said at least one surface of said substrate to impinge upon said target, thereby forming a plasma plume extending from said target to said at least one surface of said substrate, said translational motion of said target causing said plasma plume to scan over said at least one surface of the substrate, thereby depositing a film thereon.

2. The system of claim 1, further including driving means coupled to said target for enabling translational motion thereof.

3. The system of claim 2, wherein said target includes an ablation surface rotating in a plane angled with respect to said at least one surface of the substrate.

4. The system of claim 3, further including rotating means linked between said driving means and said target for enabling the rotational motion of the ablation surface of the target.

5. The system of claim 4, wherein said driving means includes a drive motor and a worm drive actuated by said drive motor and translating said target in parallel to said at least one surface of said substrate.

6. The system of claim 5, wherein said rotating means includes a pair of beveled gears angled with respect to each other, one of said pairs of beveled gears being positioned at the end of said worm drive opposite to said drive motor, and another of said pair of beveled gears supporting said target thereon, said beveled gears engaging each other.

7. The system of claim 1, wherein said energetic beam is a laser beam.

8. The system of claim 1, wherein said substrate is positioned above said target.

9. The system of claim 1, further including means for generating said energetic beam and focusing means positioned between said generating means and said target for defining said impingement segment, said focusing means being translated in synchronism with said target, thereby maintaining the fluence of said energetic beam on said target.

10. The system of claim 9, further including a rod interconnecting said focusing means and said target, thereby maintaining a distance therebetween substantially unchangeable.

11. The system of claim 9, further including an auxiliary motor enabling translational motion of said focusing means, said auxiliary motor and said drive motor being actuated in synchronism, thereby maintaining a distance between said focusing means and said target substantially unchangeable.

12. The system of claim 1, further including a plume aperture means positioned between said target and said substrate and preventing unwanted particulates from reaching said substrate.

13. The system of claim 12, wherein said plume aperture means translates in synchronism with said target.

14. The system of claim 12, wherein said target is positioned above said substrate.

15. The system of claim 1, wherein said target includes a gaseous composition.

16. The system of claim 1, wherein said substrate is rotated.

17. The system of claim 1, wherein said substrate is translated.

18. The system of claim 1, wherein said substrate further includes another surface opposite to said at least one surface thereof, said system further comprising a second target translated substantially in parallel to said another surface of the substrate, and a second energetic beam impingement segment directed substantially in parallel to said another surface to impinge upon said second target, wherein films are deposited on both surfaces of said substrate.

19. The system of claim 1, wherein said substrate is a material configuration selected from the group consisting of continuous tape, wire, plastic sheathing, or wafers.

20. The system of claim 1, wherein said substrate has a structure positioned on said at least one surface thereof, said structure having a plurality of distinct surfaces to be coated, said system further comprising a plurality of targets, each translating substantially in parallel to a respective distinct surface of said structure to be coated, and a plurality of beam splitters, splitting the energetic beam into a plurality of energetic beam portions and directing each of said energetic beam portions towards a respective one of said plurality of targets.

21. A method for film deposition, comprising the steps of:
providing a substrate having at least one surface,
providing a target at a certain distance from said substrate,
directing an energetic beam to form an impingement segment substantially in parallel to said at least one surface of the substrate, said impingement segment of said energetic beam impinging on said target, thereby forming a plasma plume extending from said target and reaching at least one surface of said substrate, and
translating said target along said substrate substantially in parallel to said at least one surface thereof, thereby depositing film on said at least one surface of said substrate.

22. The method of claim 21, further including the steps of rotating said target substantially simultaneously with translational motion thereof.

23. The method of claim 21, further including the step of translating said substrate.

24. The method of claim 21, further including the step of rotating said substrate.

25. The method of claim 21, further including the steps of providing focusing means focusing said energetic beam prior to impinging onto said target to form said impingement segment, and translating said focusing means in synchronism with said target to maintain fluence of said energetic beam at said target.

26. The method of claim 21, wherein said substrate has at least two distinct surfaces to be coated, said method further including the steps of:

providing at least one additional target, splitting said energetic beam into at least two beam portions, directing each beam portion towards a respective one of said targets, and translating each said target substantially in parallel to a respective one of said distinct surfaces on said substrate to be coated.

* * * * *